United States Patent
Suh et al.

(10) Patent No.: US 11,664,413 B2
(45) Date of Patent: May 30, 2023

(54) SEMICONDUCTOR DEVICE INCLUDING MULTILAYER STACK INCLUDING SEED LAYER AND HIGH-K DIELECTRIC LAYER

(71) Applicant: SK hynix Inc., Icheon-si (KR)

(72) Inventors: Dong Ik Suh, Icheon-si (KR); Se Ho Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 157 days.

(21) Appl. No.: 17/142,813

(22) Filed: Jan. 6, 2021

(65) Prior Publication Data
US 2021/0408222 A1 Dec. 30, 2021

(30) Foreign Application Priority Data
Jun. 26, 2020 (KR) .......................... 10-2020-0078253

(51) Int. Cl.
*H01L 29/51* (2006.01)
*H10B 12/00* (2023.01)
*H01L 49/02* (2006.01)

(52) U.S. Cl.
CPC ............ *H01L 28/40* (2013.01); *H01L 29/513* (2013.01); *H01L 29/517* (2013.01); *H10B 12/315* (2023.02)

(58) Field of Classification Search
CPC .............................. H01L 28/40; H01L 21/022
See application file for complete search history.

(56) References Cited

U.S. PATENT DOCUMENTS

| 10,497,773 B2 | 12/2019 | Chang et al. | |
| 2019/0198244 A1* | 6/2019 | Kim | ..................... H01G 4/1272 |
| 2019/0333858 A1* | 10/2019 | Kim | ..................... H01L 21/0228 |

FOREIGN PATENT DOCUMENTS

KR 1020170136826 A 12/2017

OTHER PUBLICATIONS

"Novel high-κ dielectrics for next-generation electronic devices screened by automated ab initio calculations" by Kanghoon Yim, Youn Yong, Joohee Lee, Kyuhyun Lee, Ho-Hyun Nahm, Jiho Yoo, Chanhee Lee, Cheol Seong Hwang and Seungwu Han. NPG Asia Materials 7,e190 (2015). Published Online Jun. 12, 2015.
"Structural stability and thermal properties of BeO from the quasiharmonic approximation" by Urszula D Wdowik Journal of Physics: Condensed Matter. 22.045404 (2010) Published Jan. 12, 2010 Online at stacks.iop.org/JPhysCM/22/045404.
"Atomic engineering of metastable BeO6 octahedra in a rocksalt framework" by Woo Chul Lee, Sangtae Kim, Eric S. Larsen, Jung-Hae Choi, Seung-Hyub Baek, Minji Lee, Deok-Yong Cho, Han-Koo Lee, Cheol Seong Hwang, Christopher W. Bielawski, Seong Keun Kim Applied Surface Science 501 144280 (2020). Received Aug. 2, 2019; Received in revised form Sep. 28, 2019; Accepted Oct. 4, 2019. Available online Oct. 8, 2019.

* cited by examiner

*Primary Examiner* — Nelson Garces

(57) ABSTRACT

A semiconductor device may include: a first electrode; a second electrode; and a multilayer stack that is interposed between the first electrode and the second electrode and includes a seed layer and a high-k dielectric layer, wherein each of the seed layer and the high-k dielectric layer may have a rocksalt crystal structure, and wherein the high-k dielectric layer may exhibit a dielectric constant (k) of fifty (50) or higher.

31 Claims, 18 Drawing Sheets

US 11,664,413 B2

SEMICONDUCTOR DEVICE INCLUDING MULTILAYER STACK INCLUDING SEED LAYER AND HIGH-K DIELECTRIC LAYER

CROSS-REFERENCE TO RELATED APPLICATIONS

The present application claims priority under 35 U.S.C. § 119 to Korean Patent Application No. 10-2020-0078253, filed on Jun. 26, 2020, which is incorporated herein by reference in its entirety.

BACKGROUND

1. Field

Exemplary embodiments of the present disclosure relate to a semiconductor device, and more particularly, to a semiconductor device including a multilayer stack containing a dielectric IPEC_SH20450SS_2020-01-06ayer.

2. Description of the Related Art

Recently, semiconductor memory devices have become highly integrated, and so the semiconductor memory unit cell area is reduced and the operating voltage is lowered. Accordingly, a high-k material having a high capacitance and low leakage current is required. However, because the dielectric constant (k) and the energy band gap of the dielectric material tend to be inversely proportional to each other, there are limits in practically applying a high-k material to a device.

SUMMARY

Embodiments of the present disclosure are directed to a semiconductor device including a multilayer stack containing a high-k dielectric layer having a high dielectric constant.

In accordance with an embodiment of the disclosure, a semiconductor device may include: a first electrode; a second electrode; and a multilayer stack that is interposed between the first electrode and the second electrode and includes a seed layer and a high-k dielectric layer, wherein each of the seed layer and the high-k dielectric layer may have a rocksalt crystal structure, and wherein the high-k dielectric layer may exhibit a dielectric constant (k) of fifty (50) or higher.

In accordance with another embodiment of the disclosure, a semiconductor device may include: a first electrode; a second electrode; and a multilayer stack that is interposed between the first electrode and the second electrode and includes a seed layer and a high-k dielectric layer structure, wherein the high-k dielectric layer structure may include at least two high-k dielectric layers and at least one strain applying layer, and wherein the strain applying layer may be interposed between adjacent high-k dielectric layers.

DETAILED DESCRIPTION

Figure 1:
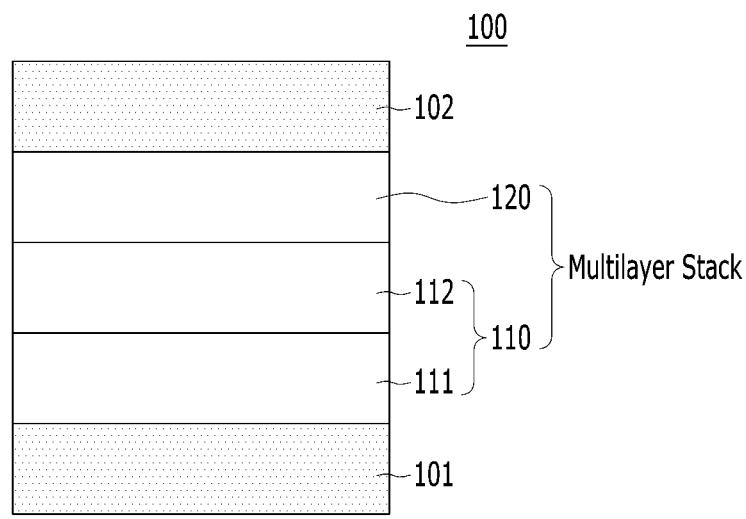
FIG. 1 illustrates a semiconductor device in accordance with an embodiment of the disclosure.

Exemplary embodiments of the disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the context of the demand for a material having a high dielectric constant and a high energy bandgap characteristic for scaling a device and improving characteristics, it has been reported that beryllium oxide (BeO) having a rocksalt crystal structure may have a high dielectric constant and a high energy bandgap. However, BeO has a rocksalt crystal structure as an unstable phase under ambient conditions, that is, under room temperature and atmospheric pressure, so BeO having a rocksalt crystal structure can show a high dielectric constant only under high pressure conditions of 100 gigapascals (GPa) or higher. Therefore, there was a practical problem in applying BeO having a rocksalt crystal structure to devices.

Recently, it has been reported that a stable beryllium-magnesium oxide ($Be_xMg_{1-x}O$) structure can be formed by doping magnesium oxide (MgO) into BeO. MgO has a stable rocksalt crystal structure under ambient conditions and structural compatibility with BeO. However, since a k value of the doped MgO is as low as about 9.8, a dielectric constant of the $Be_xMg_{1-x}O$ structure is about 15 to about 20. Thus, it is impossible to implement a high-k, that is, a high dielectric constant of 50 or higher.

In accordance with embodiments of the disclosure, a higher-k dielectric layer oriented to a rocksalt crystal structure can be formed by using a seed layer having a rocksalt crystal structure. Therefore, it is possible to implement a high-k dielectric layer having a dielectric constant of 50 or higher, which cannot be achieved with a single layer of $Be_xMg_{1-x}O$. Accordingly, it is possible to ensure sufficient operating characteristics while further scaling the memory device.

As used herein, the term "ambient conditions" may represent room temperature and pressure conditions that are not artificially adjusted and may be used interchangeably with "room temperature and atmospheric pressure conditions".

As used herein, the term "room temperature" may represent a natural temperature that is not artificially heated or cooled, and may include, for example, a temperature of about 15° C. to about 35° C., or about 18° C. to about 30° C.

As used herein, the term "atmospheric pressure" may represent a natural pressure that is not artificially pressurized or depressurized, and may include, for example, a pressure of about 0.5 atm to about 1.5 atm, or about 0.8 atm to about 1.2 atm.

As used herein, a "rocksalt" structure may represent a crystal structure in which the coordination number of each atom is 6 and a cation-anion radius ratio may range from about 0.414 to 0.732. Each cation is coordinated to 6 anions at the vertices of an octahedron, and similarly, each anion is coordinated to 6 cations at the vertices of an octahedron.

FIG. 1 illustrates a semiconductor device 100 in accordance with an embodiment of the disclosure.

Referring to FIG. 1, the semiconductor device 100 may be a portion of a memory. The semiconductor device 100 may be a portion of a volatile memory. The semiconductor device 100 may be a portion of DRAM. The semiconductor device 100 may include a DRAM capacitor.

The semiconductor device 100 may include a first electrode 101, a second electrode 102, and a multilayer stack positioned between the first electrode 101 and the second electrode 102.

The first electrode 101 may include a metal-containing material. The first electrode 101 may include a metal, a metal nitride, a metal carbide, a conductive metal nitride, a conductive metal oxide, or combinations thereof. The first electrode 101 may include titanium (Ti), titanium nitride (TiN), tantalum nitride (TaN), tungsten (W), tungsten nitride (WN), ruthenium (Ru), iridium (Ir), ruthenium oxide ($RuO_2$), iridium oxide ($IrO_2$), niobium nitride (NbN), molybdenum nitride (MoN), or a combination thereof. According to another embodiment of the disclosure, the first electrode 101 may include a silicon-containing material. For example, the first electrode 101 may include silicon, silicon germanium, or a combination thereof. According to yet another embodiment of the disclosure, the first electrode 101 may include a stack of a metal-containing material and a silicon-containing material. The first electrode 101 may be referred to as 'a bottom electrode' or a storage node.

The second electrode 102 may include a silicon-containing material, a germanium-containing material, a metal-containing material, or a combination thereof. The second electrode 102 may include a metal, a metal nitride, a metal carbide, a conductive metal nitride, a conductive metal oxide, or a combination thereof. The second electrode 102 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), niobium nitride (NbN), molybdenum nitride (MoN), iridium oxide ($IrO_2$), silicon (Si), germanium (Ge), silicon germanium (SiGe), or a combination thereof. The second electrode 102 may include 'a Si/SiGe stack' in which silicon germanium is stacked over silicon. The second electrode 102 may include 'a Ge/SiGe stack' in which silicon germanium is stacked over germanium. The second electrode 102 may be formed by stacking silicon germanium over a metal nitride. For example, the second electrode 102 may be formed by stacking silicon germanium (SiGe) over titanium nitride (TiN). According to another embodiment of the disclosure, the second electrode 102 may include titanium nitride (TiN), silicon germanium (SiGe), and tungsten (W) that are stacked in the mentioned order. According to another embodiment of the disclosure, the second electrode 102 may include titanium nitride (TiN), silicon germanium (SiGe), and tungsten nitride (WN) that are stacked in the mentioned order.

The multilayer stack may include a seed layer 110 and a high-k dielectric layer 120. The seed layer 110 may include a first seed layer 111 and a second seed layer 112. The first seed layer 111, the second seed layer 112 and the high-k dielectric layer 120 may be stacked between the first electrode 101 and the second electrode 102 in the mentioned order.

The seed layer 110 may be formed between the first electrode 101 and the high-k dielectric layer 120. The seed layer 110 may have a rocksalt crystal structure, allowing the high-k dielectric layer 120, which is formed over the seed layer 110, to be oriented to a rocksalt crystal structure. The seed layer 110 may have a dielectric constant of about 15 to about 20. The seed layer 110 may allow a high-k dielectric layer 120, having a high dielectric constant of about 50 or higher, grow over the seed layer 110.

The first seed layer 111 may include MgO having a rocksalt crystal structure, and the second seed layer 112 may include BeO having a rocksalt crystal structure. The first seed layer 111 and the second seed layer 112 may have a dielectric constant of about 15 to about 20, respectively.

MgO has a rocksalt crystal structure under ambient conditions and the same number of ions as BeO. Accordingly, MgO has a structural compatibility with BeO. By forming the seed layer 110 as a composite structure that includes the first seed layer 111 having a rocksalt crystal structure and the second seed layer 112 having a rocksalt crystal structure, it is possible to orient the high-k dielectric layer 120 to a rocksalt crystal structure by a subsequential epitaxial growth, and to stabilize a rocksalt crystal structure of the high-k dielectric layer 120 under ambient conditions, that is, under room temperature and atmospheric pressure.

The first seed layer 111 and the second seed layer 112 have a similar lattice constant to the high-k dielectric layer 120, so it is possible to orient the high-k dielectric layer 120 to a rocksalt crystal structure. Accordingly, the high-k dielectric layer 120 can have a rocksalt crystal structure as a stable phase under ambient conditions, that is, under room temperature and atmospheric pressure.

The high-k dielectric layer 120 may include a high-k material. The high-k material may have a high dielectric constant of about 50 or higher. The high-k material may include BeO having a stable rocksalt crystal structure under ambient conditions, that is, under room temperature and atmospheric pressure. The high-k material may include BeO having a rocksalt crystal structure and a high dielectric constant of about 50 or higher.

In accordance with embodiments disclosed herein, the high-k dielectric layer 120 having a high dielectric constant and oriented to a rocksalt crystal structure can be formed over the second seed layer 112 by performing an epitaxial growth of the high-k material using the first seed layer 111 and the second seed layer 112 having a similar lattice constant to the high-k dielectric layer 120. As such, by using the seed layer 110 having a rocksalt crystal structure and a similar lattice constant to the high-k dielectric layer 120, BeO with a rocksalt crystal structure as a stable phase under ambient conditions, that is, under room temperature and atmospheric pressure can be formed. As a result, it is possible to practically apply BeO with a rocksalt crystal structure to a device.

In an embodiment, the high-k dielectric layer 120 may exhibit a high dielectric constant, for example, a high dielectric constant of about 50 or higher. Such a high dielectric constant is a relatively high dielectric constant that cannot be achieved with a single layer of $Be_xMg_{1-x}O$. Therefore, in accordance with embodiments disclosed herein, it is possible to achieve further scaling and performance improvement of the memory device.

Meanwhile, in the semiconductor device 100, the high-k dielectric layer 120 may need to have a certain thickness or greater in order to exhibit sufficient properties, which include a high dielectric constant and a high band gap energy. However, during an epitaxial growth of BeO having a rocksalt crystal structure, as the thickness grows and increases, the effect of applying strain decreases. Thus, the structure of BeO tends to become a bulk wurtzite structure having a low dielectric constant, rather than a rocksalt crystal structure, so that a thicker BeO layer becomes disadvantageous in stabilization of a rocksalt crystal structure. BeO, with a bulk wurtzite structure that has a low dielectric constant of about 7.2 or lower, is difficult to use as a high-k material having a dielectric constant of 50 or higher.

Therefore, in forming the high-k dielectric layer 120, it may be required to prevent a formation of a bulk wurtzite structure having a low dielectric constant and to stabilize and maintain a rocksalt crystal structure having a high dielectric constant while securing a sufficient thickness. To this end, a method of ex-situ growing of at least two high-k dielectric layers, and a method of inserting a strain applying layer between at least two high-k dielectric layers in order to overcome a decrease in the effect of applying strain due to an increase in the thickness of the high-k dielectric layer 120, may be considered. This will be described in detail with reference to FIG. 2 and FIG. 4 to FIG. 8.

Figure 2:
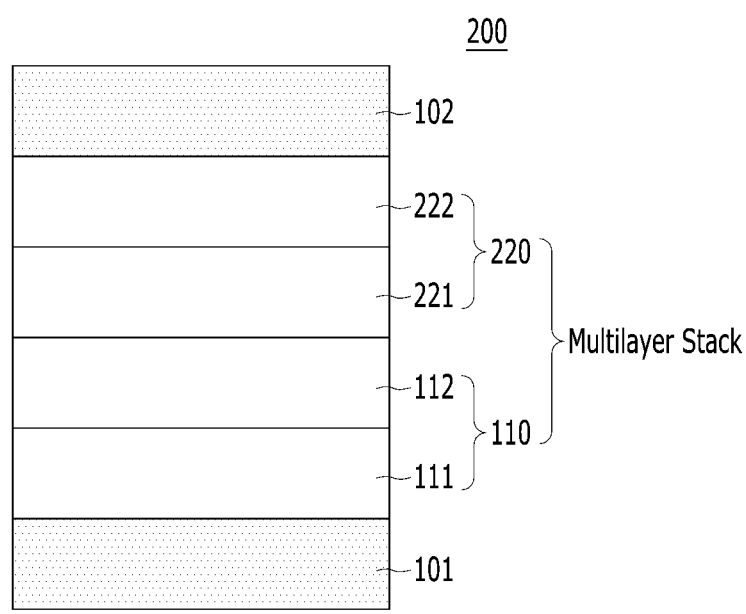
FIGS. 2 to 22 illustrate semiconductor devices in accordance with other embodiments of the disclosure.

FIG. 2 illustrates a semiconductor device in accordance with another embodiment of the disclosure. The constituent elements of a semiconductor device 200, except for a high-k dielectric layer 220, may be the same as the constituent elements of the semiconductor device 100 shown in FIG. 1. Hereinafter, as for the description of the first electrode 101, the second electrode 102, the first seed layer 111 and the second seed layer 112, FIG. 1 and the description thereof will be referred to. The semiconductor device 200 may be a portion of a memory. The semiconductor device 200 may be a portion of a volatile memory. The semiconductor device 200 may be a portion of a DRAM. The semiconductor device 200 may include a DRAM capacitor.

Referring to FIG. 2, the semiconductor device 200 may include a first electrode 101, a second electrode 102, and a multilayer stack interposed between the first electrode 101 and the second electrode 102.

The multilayer stack may include a seed layer 110 and a high-k dielectric layer 220 disposed over the seed layer 110.

The high-k dielectric layer 220 may include a first high-k dielectric layer 221 and a second high-k dielectric layer 222.

Each of the first high-k dielectric layer 221 and the second high-k dielectric layer 222 may include a high-k material. The high-k material may have a high dielectric constant of about 50 or higher. The high-k material may include BeO having a stable rocksalt crystal structure under ambient conditions, that is, under room temperature and atmospheric pressure. The high-k material may include BeO having a rocksalt crystal structure and a high dielectric constant of about 50 or higher.

The first high-k dielectric layer 221 and the second high-k dielectric layer 222 may be formed by ex-situ multi-epitaxial growth using the seed layer 110. For example, the first high-k dielectric layer 221 and the second high-k dielectric layer 222 may be formed by forming the first high-k dielectric layer 221 over the second seed layer 112 and then forming the second high-k dielectric layer 222 over the first high-k dielectric layer 221. The first high-k dielectric layer 221 may be formed by performing an epitaxial growth of a high-k material oriented to a rocksalt crystal structure by using the first seed layer 111 and the second seed layer 112 that have a similar lattice constant to the first high-k dielectric layer 221 and the second high-k dielectric layer 222. The second high-k dielectric layer 222 may be formed by performing an epitaxial growth of a high-k material oriented to a rocksalt crystal structure by using the first seed layer 111 and the second seed layer 112. The first seed layer 111 and the second seed layer 112 have a similar lattice constant to the first high-k dielectric layer 221 and the second high-k dielectric layer 222.

Compared with the semiconductor device 100 shown in FIG. 1, there is a difference in that, in the semiconductor device 200, the high-k dielectric layer 220 includes the first high-k dielectric layer 221 and the second high-k dielectric layer 222, which are formed in two-steps.

In the embodiment, by forming the high-k dielectric layer 220 including the first high-k dielectric layer 221 and the second high-k dielectric layer 222 through a two-step epitaxial growth, it is possible to prevent the formation of a bulk wurtzite structure having a low dielectric constant due to a decrease in the effect of applying strain as an increase in the overall growth thickness of the high-k dielectric layer 220. As a result, the high-k dielectric layer 220 can maintain a rocksalt crystal structure as a stable phase under ambient conditions, that is, under room temperature and atmospheric pressure. Therefore, sufficient characteristics of high-k dielectric layer 220 can be secured with an increase in a thickness of the high-k dielectric layer 220 in comparison with a thickness of the high-k dielectric layer 120 made of a single layer in the semiconductor device 100 shown in FIG. 1. At the same time, destabilization of a rocksalt crystal structure of the high-k dielectric layer 220 due to an increase in the growth thickness can be prevented and the high-k dielectric layer 220 having a high dielectric constant of 50 or higher, and having rocksalt crystal structure, can be stably formed.

In accordance with the embodiment shown in FIG. 2, the semiconductor device 200 includes the first high-k dielectric layer 221 and the second high-k dielectric layer 222. In accordance with another embodiment, a high-k dielectric layer including three or more layers may be formed.

Figure 3:
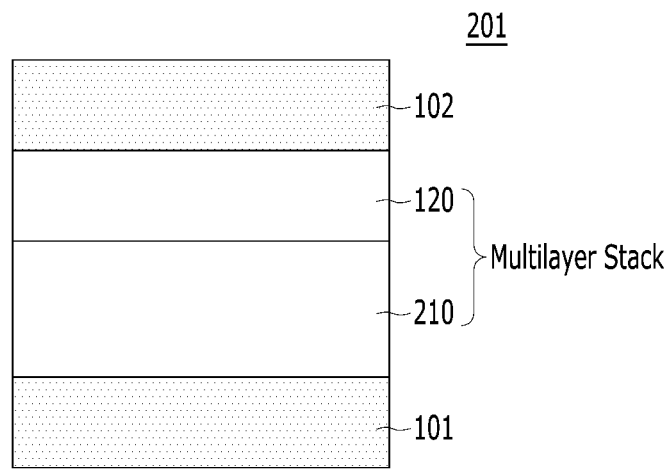

FIG. 3 illustrates a semiconductor device in accordance with another embodiment of the disclosure. The constituent elements of a semiconductor device 201 shown in FIG. 3, except for a seed layer 210, may be the same as the constituent elements of the semiconductor device 100 shown in FIG. 1. Hereinafter, as for the description of the first electrode 101, the second electrode 102 and the high-k dielectric layer 120, FIG. 1 and the description thereof will be referred to. The semiconductor device 201 may be a portion of a memory. The semiconductor device 201 may be a portion of a volatile memory. The semiconductor device 201 may be a portion of a DRAM. The semiconductor device 201 may include a DRAM capacitor.

Referring to FIG. 3, the semiconductor device 201 may include a first electrode 101, a second electrode 102 and a multilayer stack interposed between the first electrode 101 and the second electrode 102.

The multilayer stack may include a seed layer 210 and a high-k dielectric layer 120 disposed over the seed layer 210.

The seed layer 210 may include $Be_xMg_{1-x}O$ (0<x<0.5) having a rocksalt crystal structure. The seed layer 210 may have a dielectric constant of about 15 to about 20.

$Be_xMg_{1-x}O$ having a rocksalt crystal structure may be formed by doping MgO into BeO. MgO has a rocksalt crystal structure under ambient conditions and a structural compatibility with BeO, which has the same number of ions as MgO. The method of doping MgO may be suitably selected from known methods in the art in consideration of process conditions and the like. For example, it is possible to dope BeO with MgO by co-deposition through an atomic layer deposition (ALD).

Unlike BeO, which has a rocksalt crystal structure in an unstable phase under ambient conditions, $Be_xMg_{1-x}O$ having a rocksalt crystal structure can maintain a stable state under ambient conditions, that is, under room temperature and atmospheric pressure. $Be_xMg_{1-x}O$ having a rocksalt crystal structure may have a dielectric constant of about 15 to 20.

The seed layer 210 including $Be_xMg_{1-x}O$ having a rocksalt crystal structure has a similar lattice constant to the high-k dielectric layer 120, and as a result, it is possible to orient a high-k material, for example, BeO to a rocksalt crystal structure by an epitaxial growth. Accordingly, the high-k dielectric layer 120 having a dielectric constant of 50 or higher under ambient conditions, that is, under room temperature and atmospheric pressure, can be stably formed.

Figure 4:
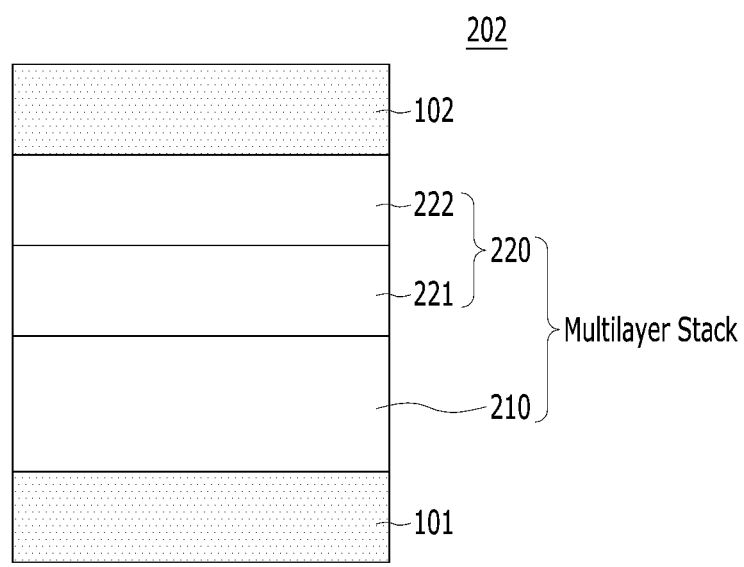

FIG. 4 illustrates a semiconductor device in accordance with another embodiment of the disclosure. The constituent elements of a semiconductor device 202, except for a high-k dielectric layer 220, may be the same as the constituent elements of the semiconductor device 201 shown in FIG. 3. Hereinafter, as for the description of the first electrode 101, the second electrode 102 and the seed layer 210, FIG. 3 and the description thereof will be referred to. The semiconductor device 202 may be a portion of a memory. The semiconductor device 202 may be a portion of a volatile memory. The semiconductor device 202 may be a portion of a DRAM. The semiconductor device 202 may include a DRAM capacitor.

Referring to FIG. 4, the semiconductor device 202 may include a first electrode 101, a second electrode 102, and a multilayer stack interposed between the first electrode 101 and the second electrode 102.

The multilayer stack may include a seed layer 210 and a high-k dielectric layer 220 disposed over the seed layer 210.

The high-k dielectric layer 220 may include a first high-k dielectric layer 221 and a second high-k dielectric layer 222.

Each of the first high-k dielectric layer 221 and the second high-k dielectric layer 222 may include a high-k material. The high-k material may have a high dielectric constant of about 50 or higher. The high-k material may include BeO having a stable rocksalt crystal structure under ambient conditions, that is, under room temperature and atmospheric pressure. The high-k material may include BeO having a rocksalt crystal structure and a high dielectric constant of about 50 or higher.

The first high-k dielectric layer 221 and the second high-k dielectric layer 222 may be formed by ex-situ multi-epitaxial growth using the seed layer 210. For example, the first high-k dielectric layer 221 and the second high-k dielectric layer 222 may be formed by forming the first high-k dielectric layer 221 over the seed layer 210 and then forming the second high-k dielectric layer 222 over the first high-k dielectric layer 221. The first high-k dielectric layer 221 may be formed by performing an epitaxial growth of a high-k material oriented to a rocksalt crystal structure by using the seed layer 210 that has a similar lattice constant to the first high-k dielectric layer 221 and the second high-k dielectric layer 222. The second high-k dielectric layer 222 may be formed by performing an epitaxial growth of a high-k material oriented to a rocksalt crystal structure by using the seed layer 210, which has a similar lattice constant to the first high-k dielectric layer 221 and the second high-k dielectric layer 222. Compared with the semiconductor device 201 shown in FIG. 3, there is a difference in that, in the semiconductor device 202, the high-k dielectric layer 220 includes the first high-k dielectric layer 221 and the second high-k dielectric layer 222, which are formed in two-steps.

In the embodiment, by forming the high-k dielectric layer 220 including the first high-k dielectric layer 221 and the second high-k dielectric layer 222 through a two-step epitaxial growth, it is possible to prevent the formation of a bulk wurtzite structure having a low dielectric constant due to a decrease in the effect of applying strain as an increase in the overall growth thickness of the high-k dielectric layer 220. As a result, the high-k dielectric layer 220 can maintain a rocksalt crystal structure as a stable phase under ambient conditions, that is, under room temperature and atmospheric pressure. Therefore, sufficient characteristics of high-k dielectric layer 220 can be secured with an increase in a thickness of the high-k dielectric layer 220 in comparison with a thickness of the high-k dielectric layer 120 made of a single layer in the semiconductor device 201 shown in FIG. 3.

In accordance with the embodiment shown in FIG. 4, the semiconductor device 202 includes the first high-k dielectric layer 221 and the second high-k dielectric layer 222. In accordance with another embodiment, a high-k dielectric layer including three or more layers may be formed.

The semiconductor device 200 shown in FIG. 2 and the semiconductor device 202 shown in FIG. 4 include the high-k dielectric layer 220 containing at least two layers, namely the high-k dielectric layers 221 and 222, formed by ex-situ multi-epitaxial growth in order to increase a total thickness of the high-k dielectric layer 220. Alternatively, a strain applying layer may be included in order to overcome a decrease in the effect of applying strain due to an increase in a thickness of the high-k dielectric layer. This will be described in detail with reference to FIGS. 5 to 8.

Figure 5:
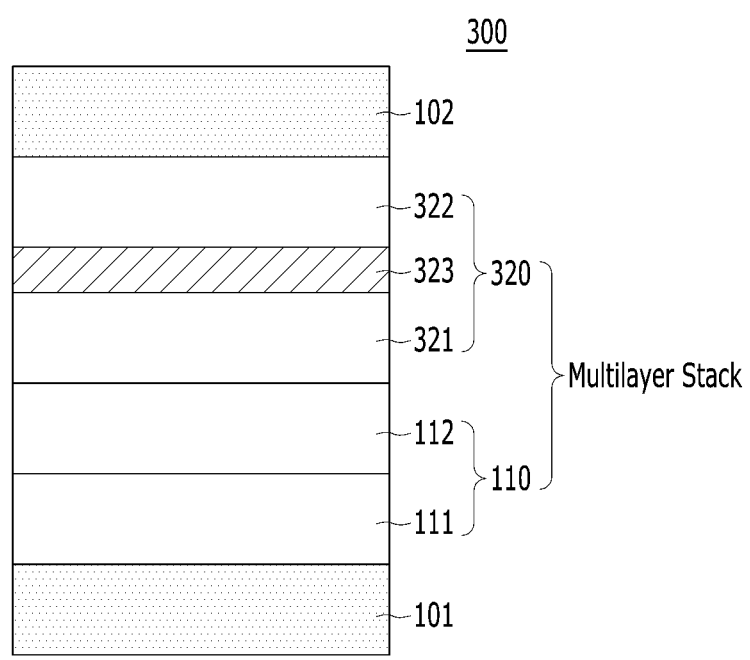

FIG. 5 illustrates a semiconductor device in accordance with another embodiment of the disclosure. The constituent elements of a semiconductor device 300, except for a high-k dielectric layer structure 320, may be the same as the constituent elements of the semiconductor device 100 shown in FIG. 1. Hereinafter, as for the description of the first electrode 101, the second electrode 102, the first seed layer 111 and the second seed layer 112, FIG. 1 and the description thereof will be referred to. The semiconductor device 300 may be a portion of a memory. The semiconductor device 300 may be a portion of a volatile memory. The semiconductor device 300 may be a portion of a DRAM. The semiconductor device 300 may include a DRAM capacitor.

Referring to FIG. 5, the semiconductor device 300 may include a first electrode 101, a second electrode 102, and a multilayer stack interposed between the first electrode 101 and the second electrode 102.

The multilayer stack may include a seed layer 110 and a high-k dielectric layer structure 320 disposed over the seed layer 110. The seed layer 110 may include a first seed layer 111 and a second seed layer 112. The high-k dielectric layer structure 320 may include a first high-k dielectric layer 321, a strain applying layer 323 and a second high-k dielectric layer 322. The first high-k dielectric layer 321, the strain applying layer 323 and the second high-k dielectric layer 322 may be formed between the seed layer 110 and the second electrode 102 in the mentioned order.

Each of the first high-k dielectric layer 321 and the second high-k dielectric layer 322 may include a high-k material. The high-k material may have a high dielectric constant of about 50 or higher. The high-k material may include BeO having a stable rocksalt crystal structure under ambient conditions, that is, under room temperature and atmospheric pressure. The high-k material may include BeO having a rocksalt crystal structure and a high dielectric constant of about 50 or higher.

The strain applying layer 323 may be interposed between the first high-k dielectric layer 321 and the second high-k dielectric layer 322.

The strain applying layer 323 can apply strain to the first high-k dielectric layer 321 and the second high-k dielectric layer 322 compensate for a decrease in the strain applying effect due to an increase in a total thickness of the high-k dielectric layer 320. Therefore, it is possible to overcome problems arising when a rocksalt crystal structure of the high-k dielectric layer 320 becomes unstable.

The strain applying layer 323 may include MgO, $Be_xMg_{1-x}O$ (0<x<0.5), or a combination thereof.

In this way, by interposing the strain applying layer 323 between the first high-k dielectric layer 321 and the second high-k dielectric layer 322, the first high-k dielectric layer 321 and the second high-k dielectric layer 322 can maintain a rocksalt crystal structure as a stable phase under ambient conditions, that is, under room temperature and atmospheric pressure. Accordingly, the first high-k dielectric layer 321 and the second high-k dielectric layer 322 can each exhibit a high dielectric constant. At the same time, an overall thickness of the high-k dielectric layer 320 can be increased, allowing the high-k dielectric layer 320 to exhibit sufficient characteristics of the high-k dielectric layer 320.

In accordance with the embodiment shown in FIG. 5, the semiconductor device 300 includes one strain applying layer 323. In accordance with another embodiment, two or more of strain applying layers may be formed. This will be described in detail with reference to FIG. 6.

Figure 6:
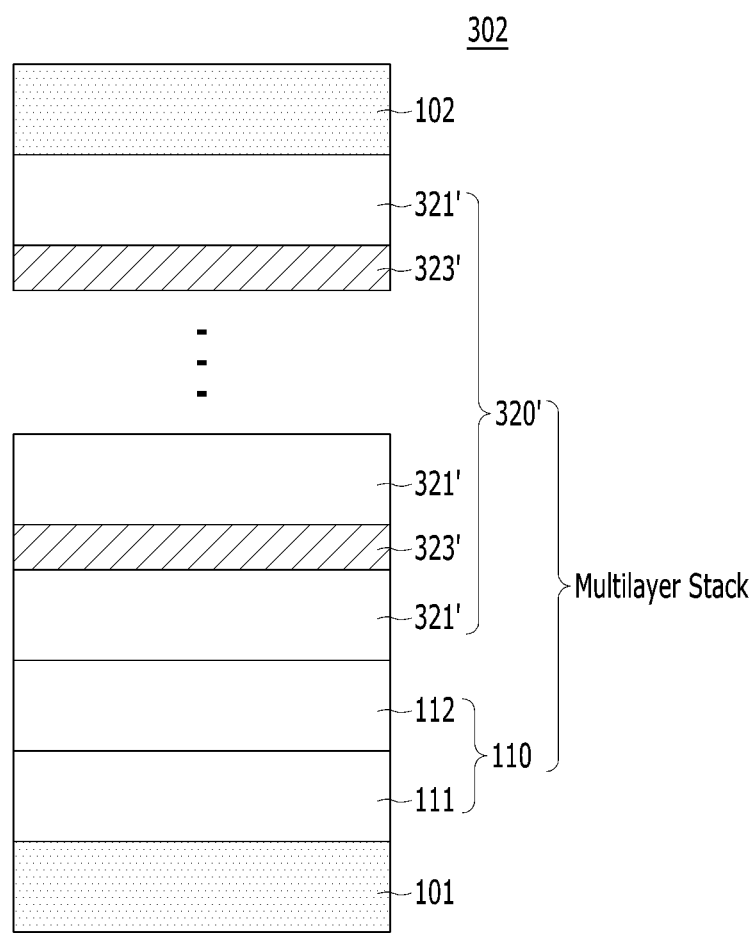
Figure 7:
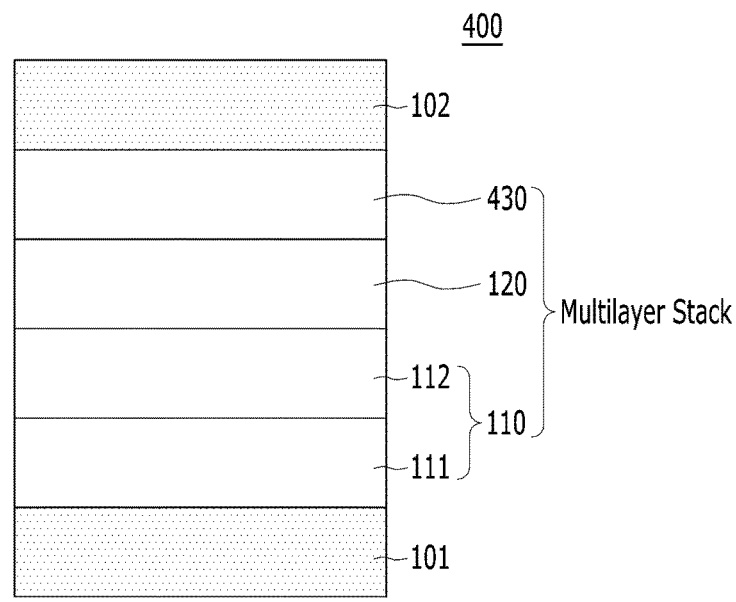
Figure 8:
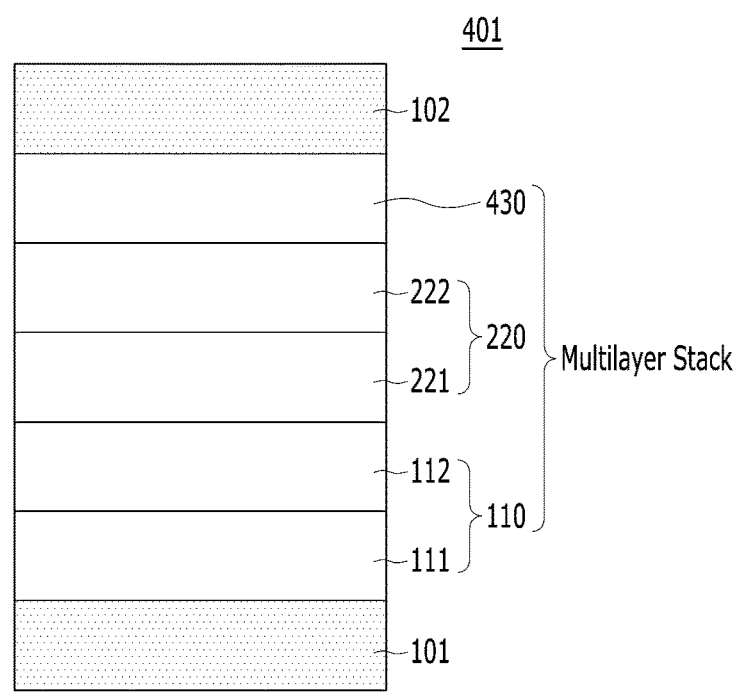
Figure 9:
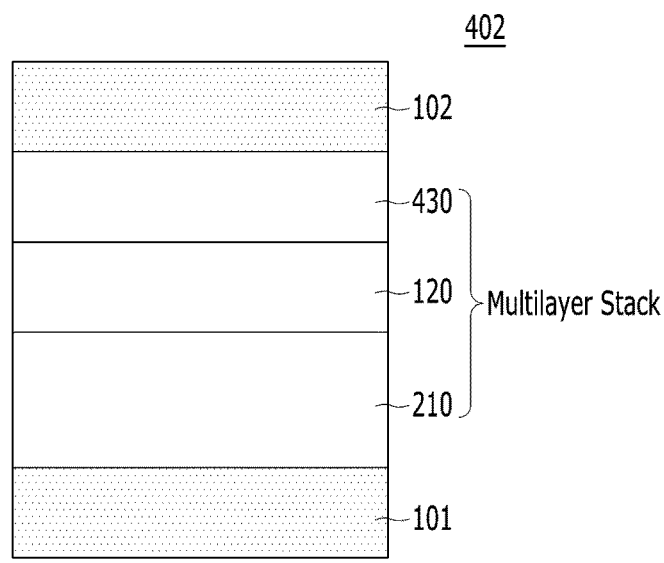
Figure 10:
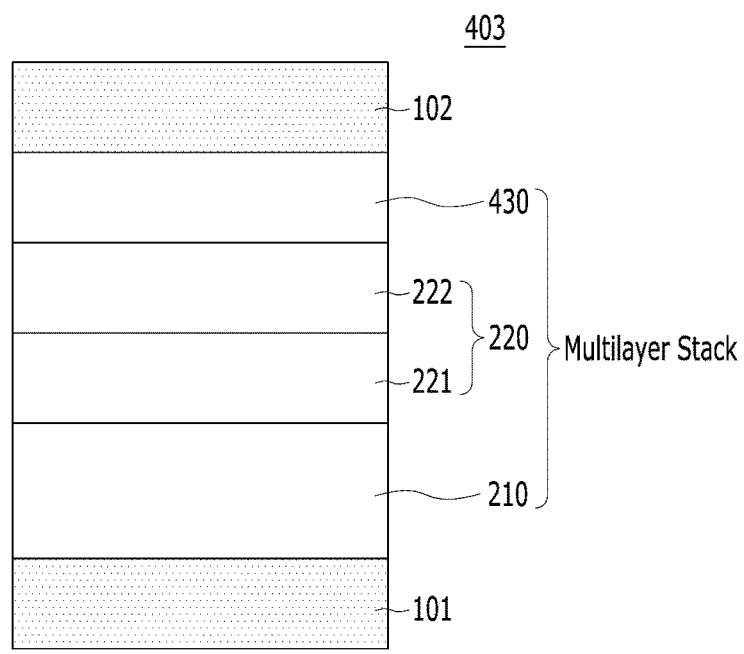
Figure 11:
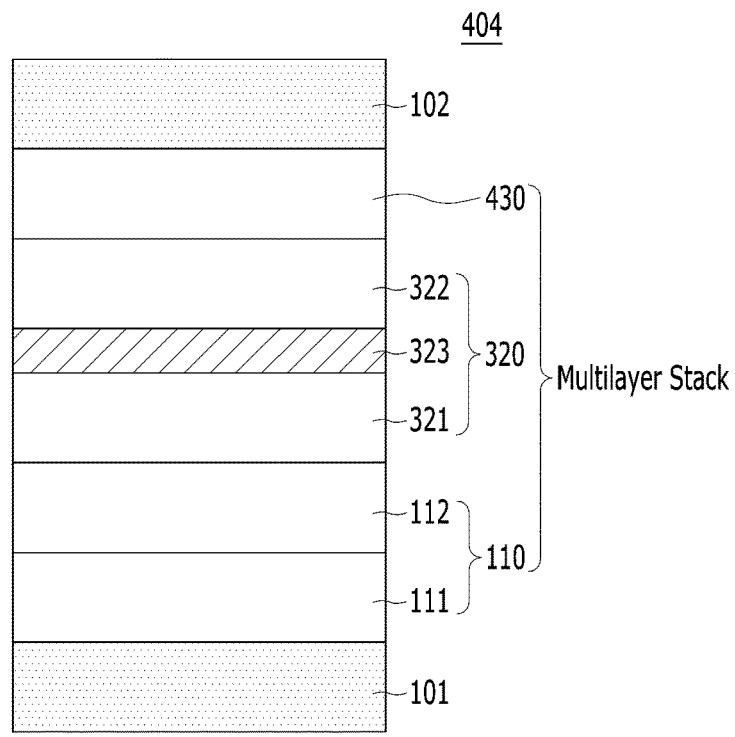
Figure 12:
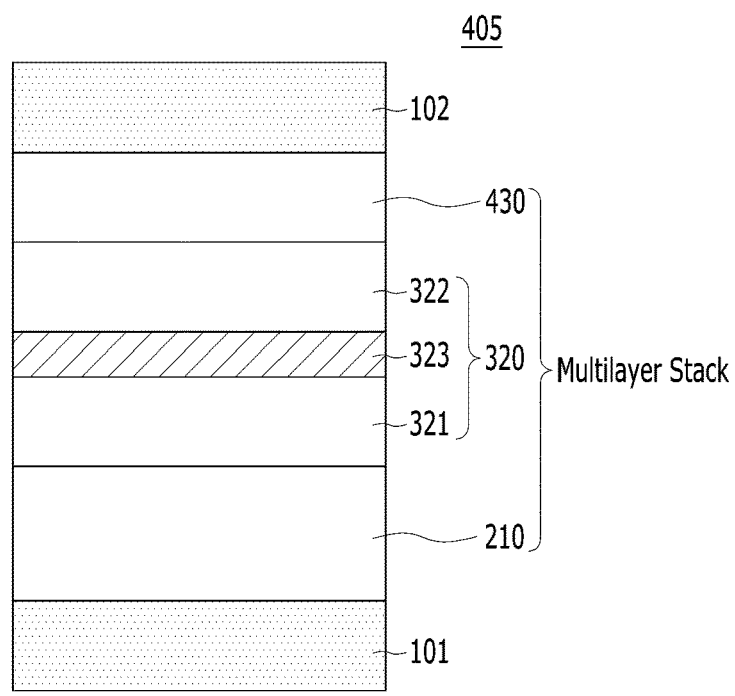

FIG. 6 illustrates a semiconductor device in accordance with another embodiment of the disclosure. The constituent elements of a semiconductor device 302, except for a high-k dielectric layer structure 320', may be the same as the constituent elements of the semiconductor device 100 shown in FIG. 1. Hereinafter, as for the description of the first electrode 101, the second electrode 102, the first seed layer 111 and the second seed layer 112, FIG. 1 and the description thereof will be referred to. The semiconductor device 302 may be a portion of a memory. The semiconductor device 302 may be a portion of a volatile memory. The semiconductor device 302 may be a portion of a DRAM. The semiconductor device 302 may include a DRAM capacitor.

Referring to FIG. 6, the semiconductor device 302 may include a first electrode 101, a second electrode 102, and a multilayer stack interposed between the first electrode 101 and the second electrode 102.

The multilayer stack may include a seed layer 110 and a high-k dielectric layer structure 320' disposed over the seed layer 110. The seed layer 110 may include a first seed layer 111 and a second seed layer 112.

The high-k dielectric layer structure 320' may include at least two strain applying layers 323', and each of the strain applying layers 323' may be interposed between adjacent high-k dielectric layers 321'. For example, the high-k dielectric layer structure 320' may include a stack including the high-k dielectric layer 321'/strain applying layer 323'/high-k dielectric layer 321'/strain applying layer 323'/high-k dielectric layer 321'. In another example, the high-k dielectric layer structure 320' may include a stack including the high-k dielectric layer 321'/strain applying layer 323'/high-k dielectric layer 321'/strain applying layer 323'/high-k dielectric layer 321'/strain applying layer 323'/high-k dielectric layer 321'.

Each of the high-k dielectric layers 321' may include a high-k material. The high-k material may have a high dielectric constant of about 50 or higher. The high-k material may include BeO having a stable rocksalt crystal structure under ambient conditions, that is, under room temperature and atmospheric pressure. The high-k material may include BeO having a rocksalt crystal structure and a high dielectric constant of about 50 or higher.

The thickness of each high-k dielectric layer 321' may be the same as or different from each other.

The strain applying layer 323' may be interposed between two adjacent high-k dielectric layers 321'. The strain applying layer 323' can apply strain to two adjacent high-k dielectric layers 321' to compensate for a decrease in the strain applying effect due to an increase in an overall thickness of the high-k dielectric layer structure 320. Therefore, it is possible to overcome problems arising when a rocksalt crystal structure of the high-k dielectric layer 321' becomes unstable. The strain applying layer 323' may include MgO, $Be_xMg_{1-x}O$ (0<x<0.5), or a combination thereof. Therefore, by interposing the strain applying layer 323' between two adjacent high-k dielectric layers 321', each high-k dielectric layer 321' can maintain a rocksalt crystal structure as a stable phase under ambient conditions, that is, under room temperature and atmospheric pressure. Accordingly, high-k dielectric layers 321' can exhibit a high dielectric constant. At the same time, an overall thickness of the high-k dielectric layer structure 320 can be increased, allowing the high-k dielectric layer 320 to exhibit sufficient characteristics of the high-k dielectric layer 320.

Meanwhile, in accordance with another embodiment of the disclosure, a high-k dielectric layer may further include an additional high-k dielectric layer containing a common high-k material. This will be described in detail with reference to FIGS. 7 to 14.

FIGS. 7 to 14 illustrate semiconductor devices in accordance with other embodiments of the disclosure.

The constituent elements of semiconductor devices 400, 401, 402, 403, 404, 405, 406 and 407 shown in FIGS. 7 to 14, except for an additional high-k dielectric layer 430, may be the same as the constituent elements of the semiconductor devices 100, 200, 201, 202, 300, and 302 shown in FIGS. 1 to 6, respectively. Hereinafter, as for the description of the constituent elements except for the additional high-k dielectric layer 430, FIGS. 1 to 6 and the description thereof will be referred to. The semiconductor devices 400, 401, 402, 403, 404, 405, 406 and 407 may be a portion of a memory. The semiconductor devices 400, 401, 402, 403, 404, 405, 406 and 407 may be a portion of a volatile memory. The semiconductor devices 400, 401, 402, 403, 404, 405, 406 and 407 may be a portion of a DRAM. The semiconductor devices 400, 401, 402, 403, 404, 405, 406 and 407 may include a DRAM capacitor.

Referring to FIGS. 7 to 14, the semiconductor devices 400, 401, 402, 403, 404, 405, 406 and 407 may further include an additional high-k dielectric layer 430.

Figure 13:
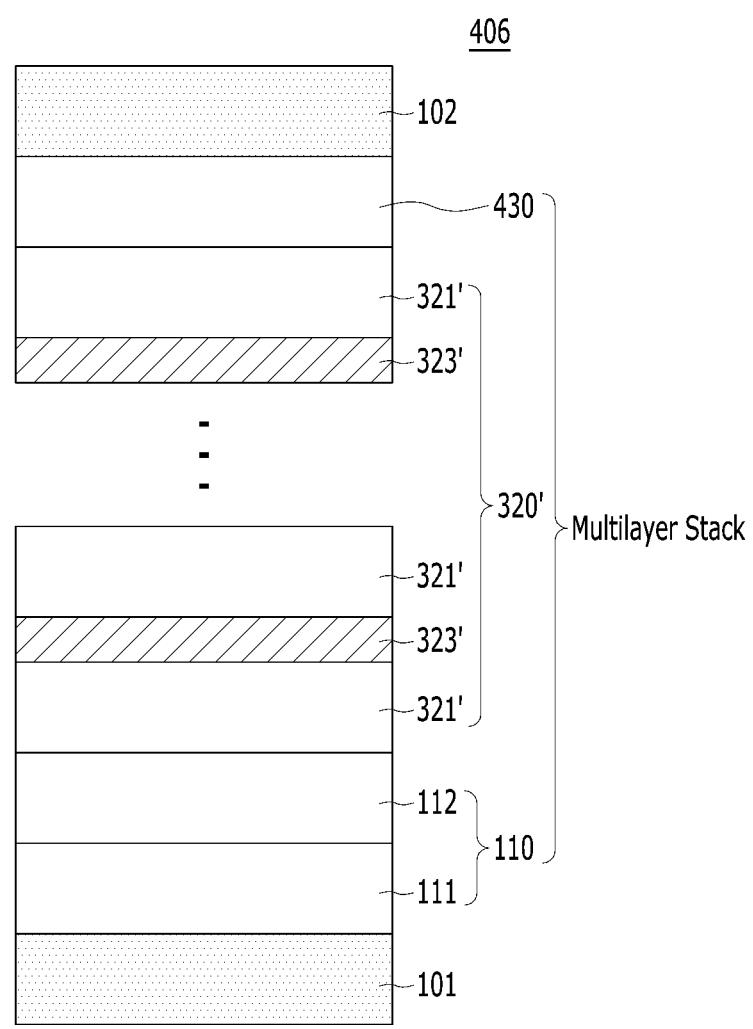
Figure 14:
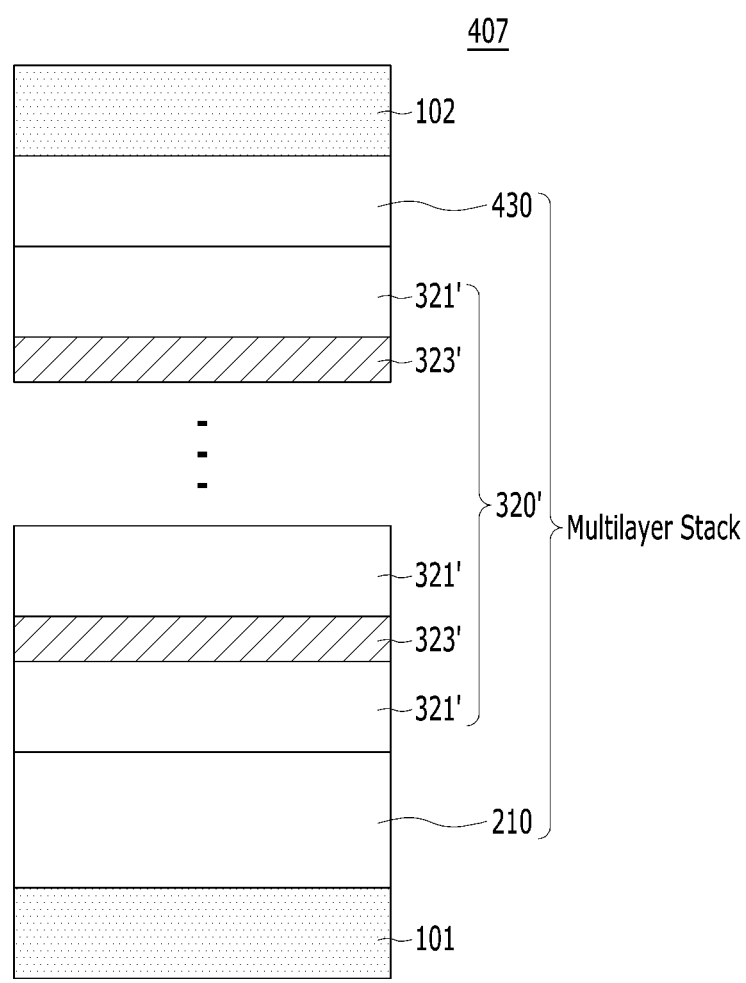
Figure 15:
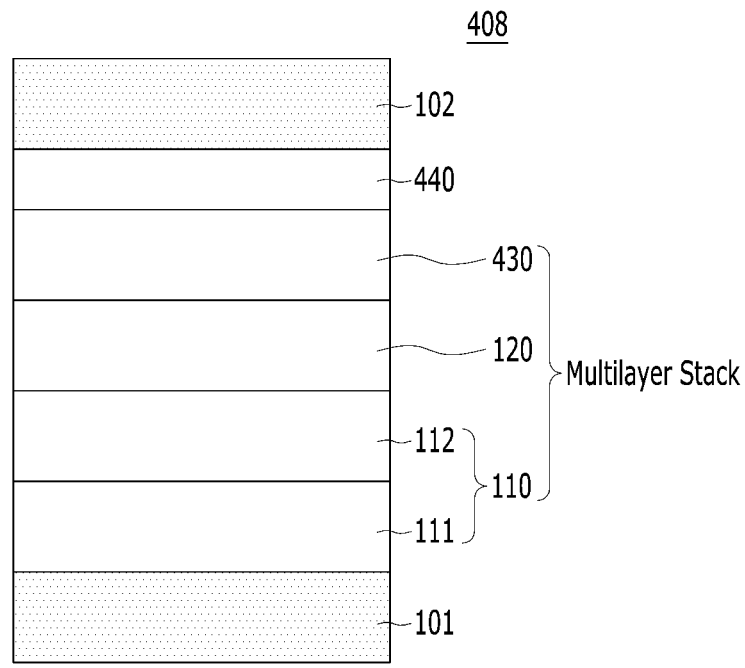
Figure 16:
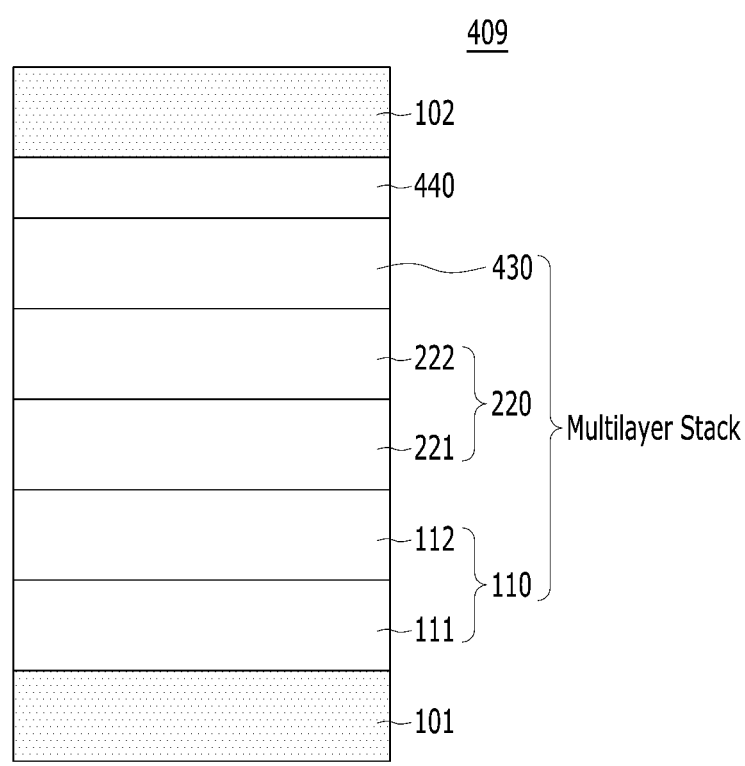
Figure 17:
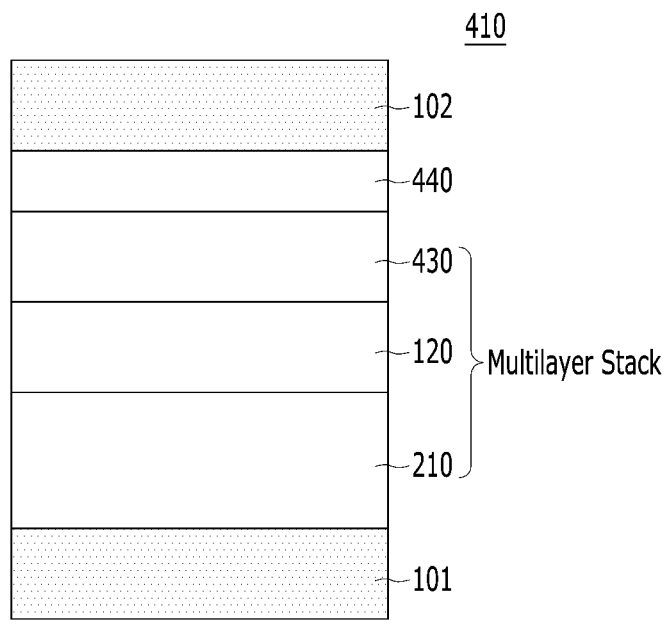
Figure 18:
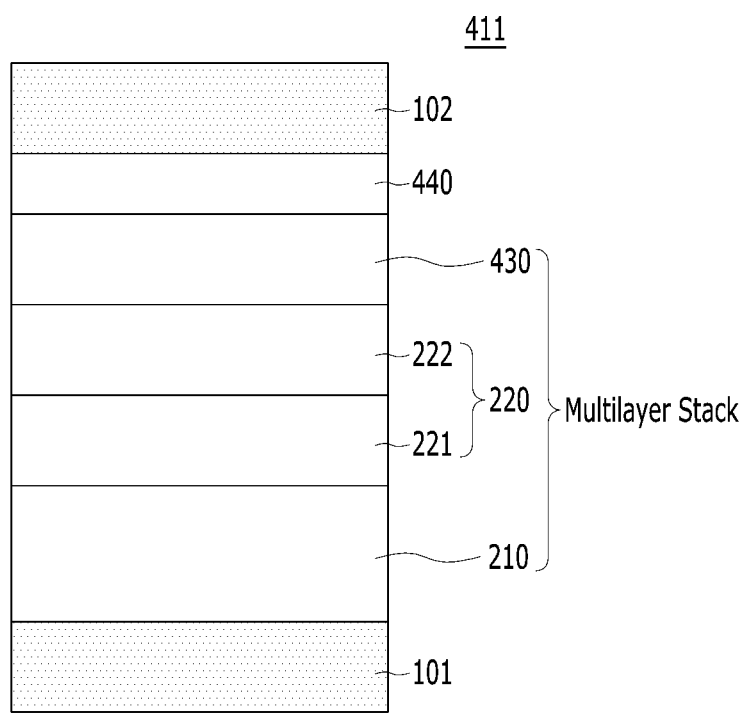
Figure 19:
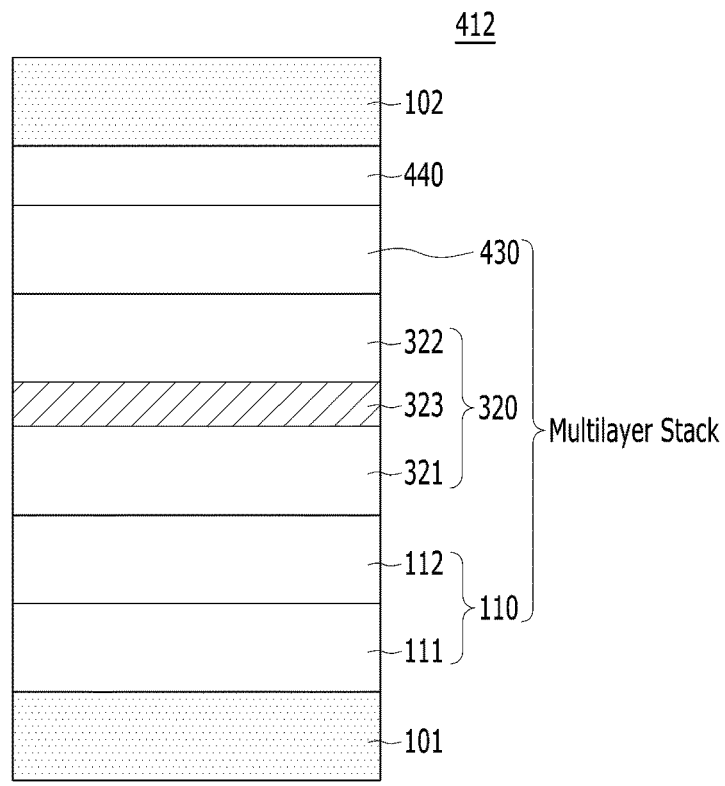
Figure 20:
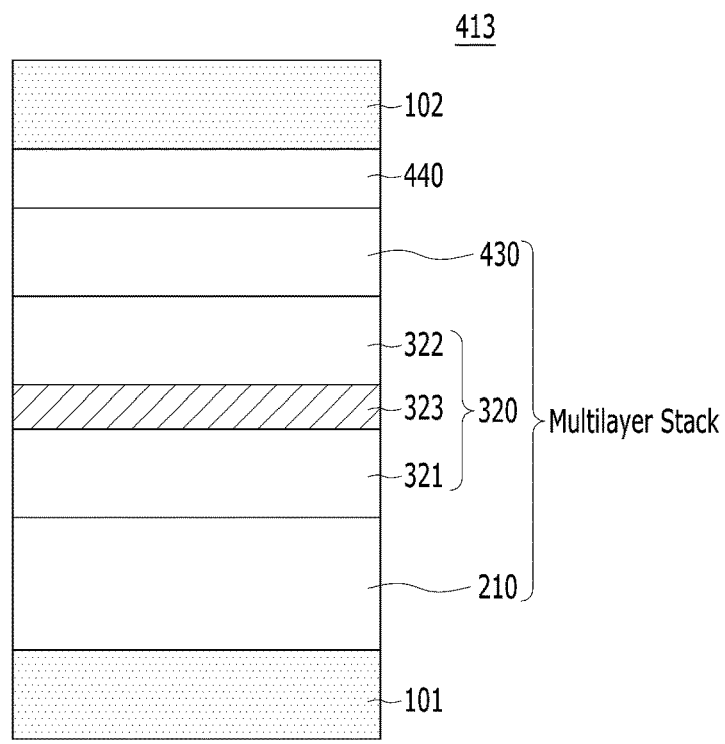
Figure 21:
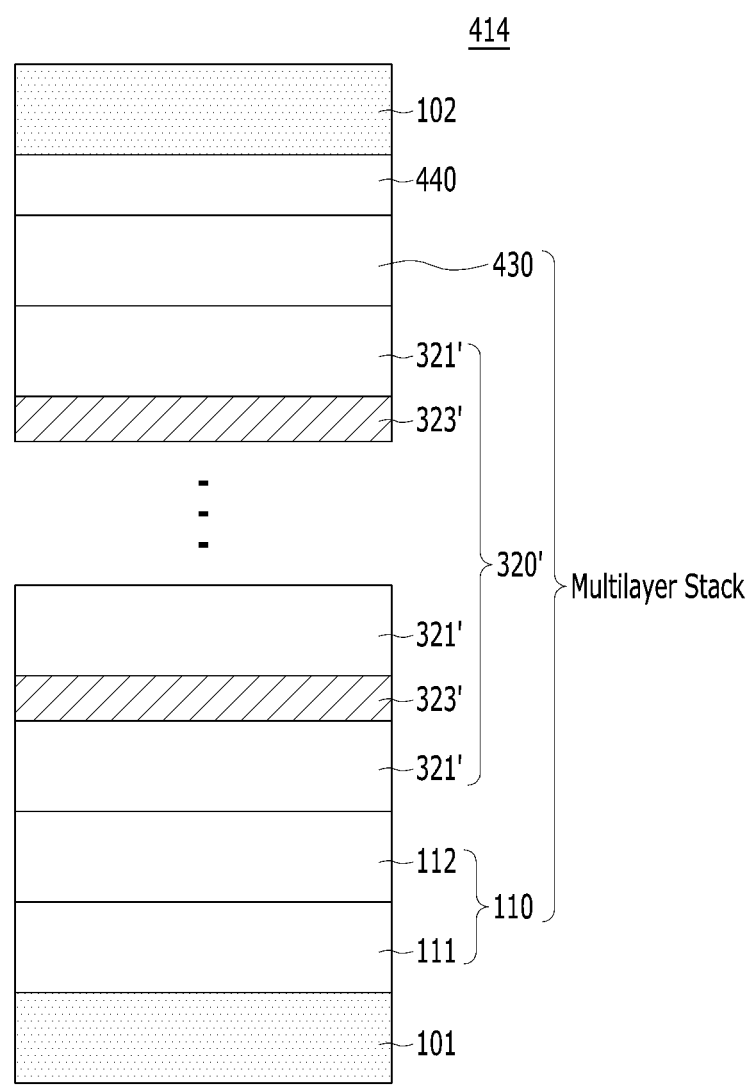
Figure 22:
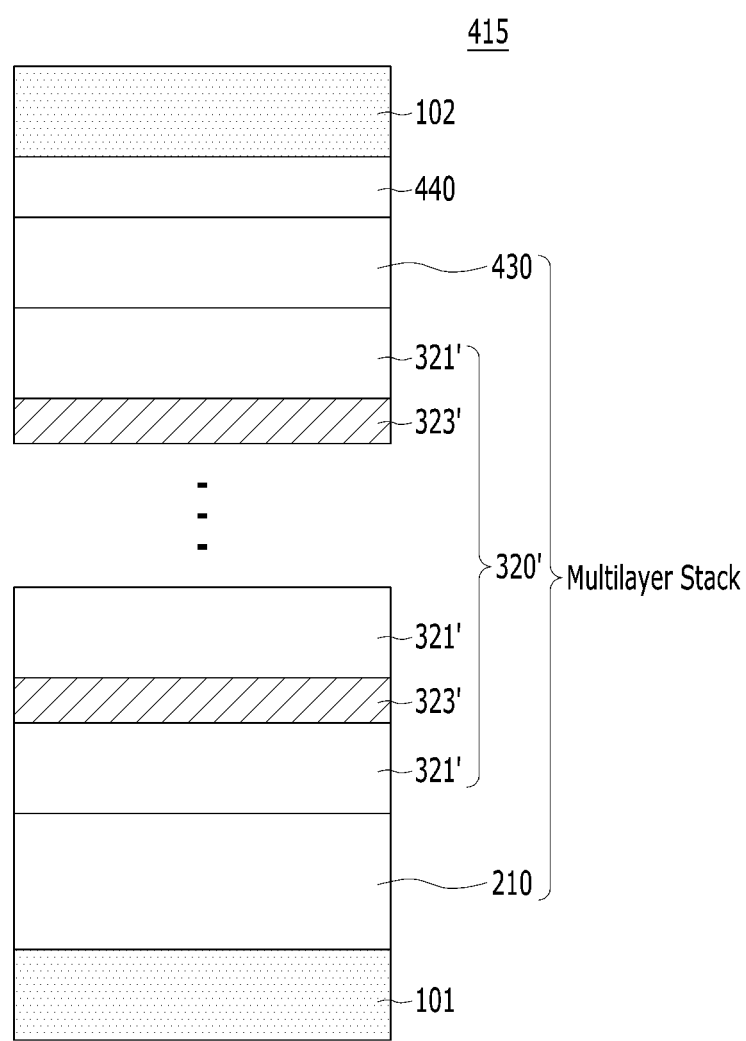

The additional high-k dielectric layer 430 may be disposed between a high-k dielectric layer 120 and a second electrode 102 (see FIGS. 7 and 9), or between the high-k dielectric layer 220 and the second electrode 102 (see FIGS. 8 and 10), or between a high-k dielectric layer structure 320 and the second electrode 102 (see FIGS. 11 and 12), or between a high-k dielectric layer structure 320' and the second electrode 102 (see FIGS. 13 and 14).

The additional high-k dielectric layer 430 may include a common high-k material. The additional high-k dielectric layer 430 may include a high-k material having a high dielectric constant higher than a silicon oxide ($SiO_2$). For example, the additional high-k dielectric layer 430 may have a dielectric constant of about 4 to about 40.

The additional high-k dielectric layer 430 may include a material different from the high-k dielectric layers 120 and 321', different from the first high-k dielectric layers 221 and 321, and different from the second high-k dielectric layers 222 and 322. A material included in the additional high-k dielectric layer 430 may have a dielectric constant lower than the high-k dielectric layers 120 and 321', lower than the first high-k dielectric layers 221 and 321, and lower than the second high-k dielectric layers 222 and 322.

In exemplary embodiments, the additional high-k dielectric layer 430 may include a zirconium oxide ($ZrO_2$), a hafnium oxide ($HfO_2$), a hafnium zirconium oxide ($Hf_xZr_{1-x}O_2$), an aluminum oxide ($Al_2O_3$), or a combination thereof, wherein $0.3<x<1.0$. The additional high-k dielectric layer 430 may include a single-layer structure or a multilayer structure.

For example, the additional high-k dielectric layer 430 may have a single layer structure including a zirconium oxide ($ZrO_2$), a hafnium oxide ($HfO_2$), a hafnium zirconium oxide ($Hf_xZr_{1-x}O_2$), an aluminum oxide ($Al_2O_3$), or a combination thereof.

Alternatively, for example, the additional high-k dielectric layer 430 may include a multilayer structure including a zirconium oxide ($ZrO_2$), a hafnium oxide ($HfO_2$), a hafnium zirconium oxide ($Hf_xZr_{1-x}O_2$), an aluminum oxide ($Al_2O_3$), or a combination thereof.

Meanwhile, in accordance with other embodiments, the semiconductor device may further include an interface layer. This will be described in detail with reference to FIGS. 15 to 22.

FIGS. 15 to 22 illustrate semiconductor devices in accordance with other embodiments of the disclosure.

The constituent elements of semiconductor devices 408, 409, 410, 411, 412, 413, 414 and 415 shown in FIGS. 15 to 22, except for an interface layer 440, may be the same as the constituent elements of the semiconductor devices 400, 401, 402, 403, 404, 405, 406 and 407 shown in FIGS. 7 to 14. Hereinafter, as for the description of the constituent elements of semiconductor devices 408, 409, 410, 411, 412, 413, 414 and 415 except for an interface layer 440, FIGS. 7 to 14 and the description thereof, and FIGS. 1 to 6 and the description thereof, will be referred to. The semiconductor devices 408, 409, 410, 411, 412, 413, 414 and 415 may be a portion of a memory. The semiconductor devices 408, 409, 410, 411, 412, 413, 414 and 415 may be a portion of a volatile memory. The semiconductor devices 408, 409, 410, 411, 412, 413, 414 and 415 may be a portion of a DRAM. The semiconductor devices 408, 409, 410, 411, 412, 413, 414 and 415 may include a DRAM capacitor.

Referring to FIGS. 15 to 22, the semiconductor devices 408, 409, 410, 411, 412, 413, 414 and 415 may further include an interface layer 440.

The interface layer 440 may be interposed between a second electrode 102 and a multilayer stack.

The interface layer 440 may serve to suppress leakage current of a high-k dielectric layer such as a high-k dielectric layer 430 or 120 for example. The interface layer 440 may serve to protect the high-k dielectric layer when the second electrode 102 is formed. The interface layer 440 may include a material that is more readily reduced rather than the high-k dielectric layer when the second electrode 102 is formed.

The interface layer 440 may serve to prevent reduction of the high-k dielectric layer. The interface layer 440 may serve as a leakage current barrier having a large effective work function (eWF) and a large conduction band offset (CBO). Also, the interface layer 440 may not increase the equivalent oxide film thickness $T_{ox}$ of the high-k dielectric layer. The interface layer 440 may serve as a portion of the second electrode 102.

The interface layer 440 may be a material having a relatively large electronegativity. For example, the interface layer 440 may have a larger Pauling electronegativity than the high-k dielectric layer. The interface layer 440 may include a material having a greater Pauling electronegativity (which is, hereinafter, simply referred to as 'an electronegativity') than the high-k dielectric layers 120 and 321', the first high-k dielectric layers 221 and 321, the second high-k dielectric layers 222 and 322, and the additional high-k dielectric layer 430. When the electronegativity is large, it may be hardly oxidized and readily reduced. Therefore, the interface layer 440 may lose oxygen in place of the high-k dielectric layer, and thus the interface layer 440 may prevent oxygen loss of the high-k dielectric layer.

The interface layer 440 may include titanium oxide, tantalum oxide, niobium oxide, aluminum oxide, silicon oxide ($SiO_2$), tin oxide, germanium oxide, molybdenum dioxide, molybdenum trioxide, iridium oxide, ruthenium oxide, nickel oxide, or a combination thereof.

Figure 23A:
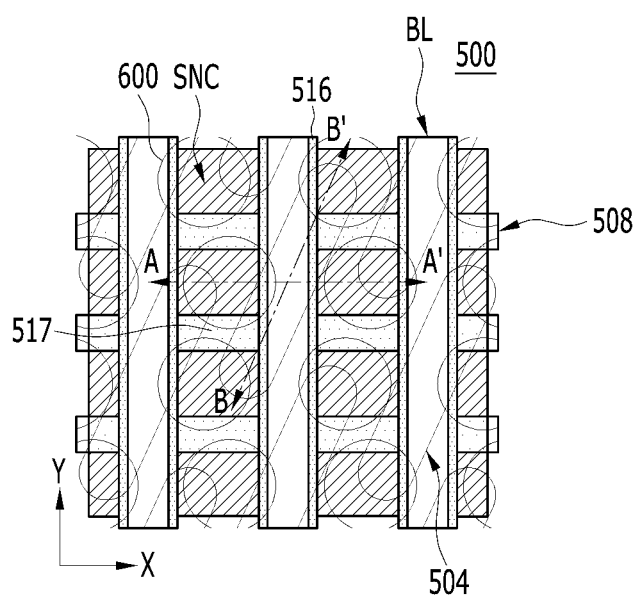
FIGS. 23A to 23C are diagrams illustrating memory cells.
Figure 23B:
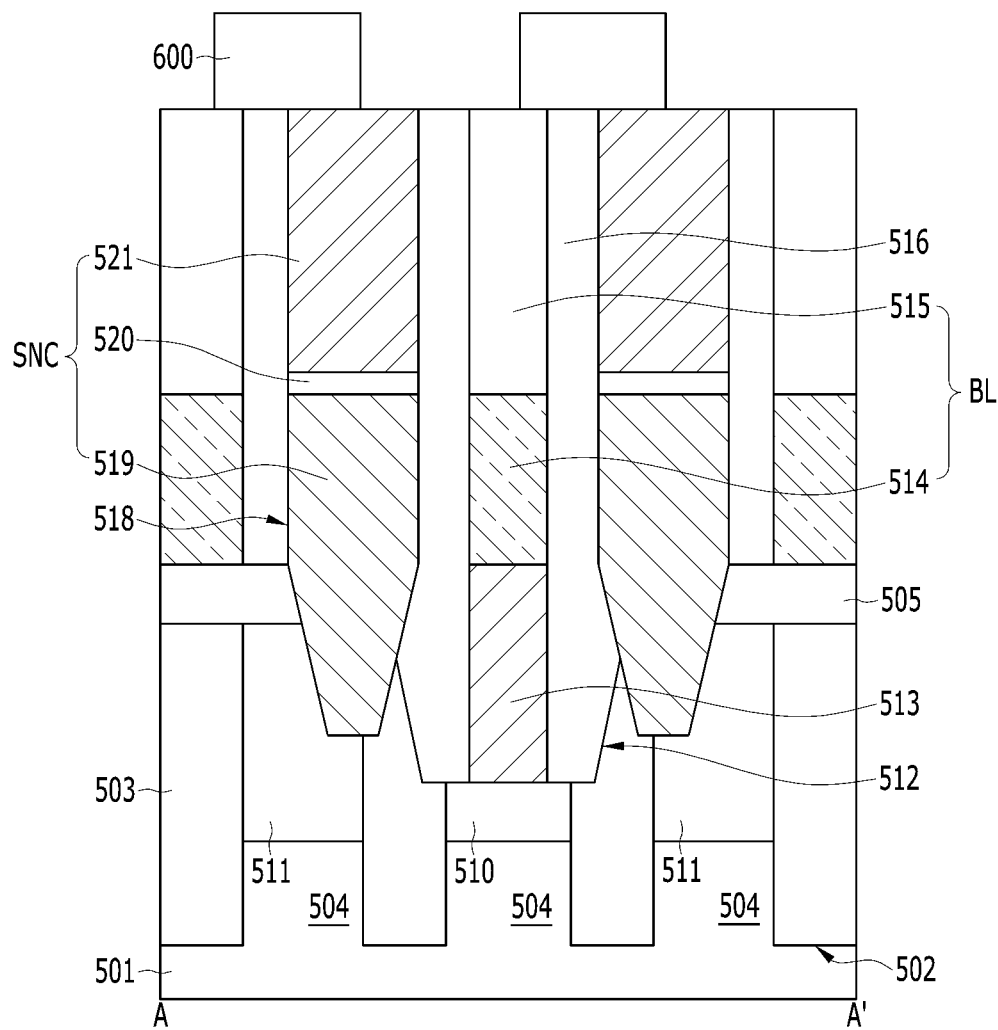
Figure 23C:
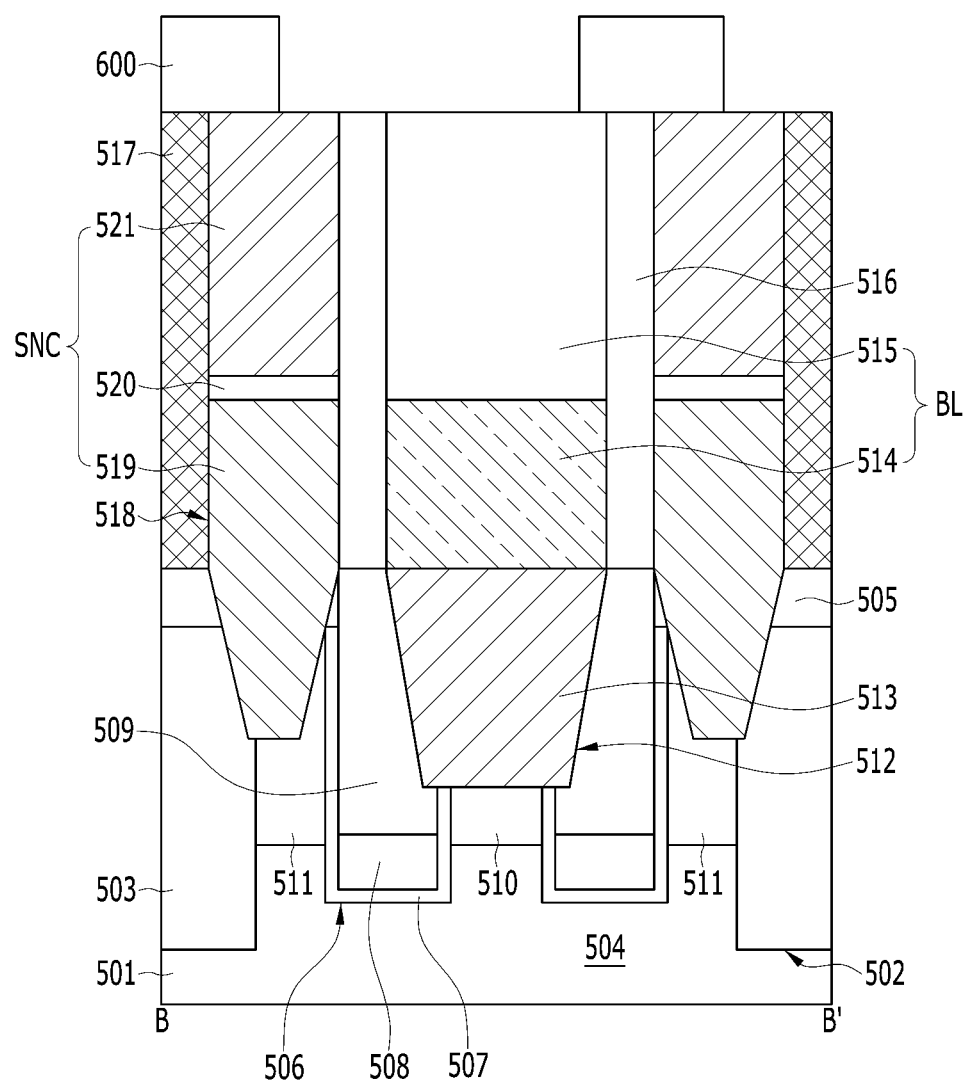

FIGS. 23A to 23C are diagrams illustrating memory cells. FIG. 23B is a cross-sectional view taken along a line A-A' in FIG. 23A. FIG. 23C is a cross-sectional view taken along a line B-B' in FIG. 23A.

A memory cell 500 may include a cell transistor including a buried word line 508, a bit line 514, and a capacitor 600. The capacitor 600 may include a multilayer stack, and the multilayer stack may include one from among the multilayer stacks of the above-described embodiments of the disclosure.

The memory cell 500 will be described in detail.

An isolation layer 503 and an active region 504 may be formed over the substrate 501. A plurality of active regions 504 may be defined by the isolation layer 503. The substrate 501 may be a material appropriate for semiconductor processing. The substrate 501 may include a semiconductor substrate. The substrate 501 may be formed of a material containing silicon. The substrate 501 may include silicon, monocrystalline silicon, polysilicon, amorphous silicon, silicon germanium, monocrystalline silicon germanium, polycrystalline silicon germanium, carbon-doped silicon, combinations thereof, or multi-layers thereof. The substrate 501 may also include other semiconductor materials, such as germanium. The substrate 501 may include a group-III/V semiconductor substrate, for example, a compound semiconductor substrate, such as GaAs. The substrate 501 may include a Silicon On Insulator (SOI) substrate. The isolation layer 503 may be formed in the isolation trench 502 by a Shallow Trench Isolation (STI) process.

A word line trench 506 may be formed in the substrate 501. The word line trench 506 may be referred to as a gate trench. A gate dielectric layer 507 may be formed on the surface of the word line trench 506. A buried word line 508 partially filling the word line trench 506 may be formed over the gate dielectric layer 507. The buried word line 508 may be referred to as a buried gate electrode. A word line capping layer 509 may be formed over the buried word line 508. The top surface of the buried word line 508 may be positioned at a lower level than the surface of the substrate 501. The buried word line 508 may be a low resistance metal material.

The buried word line 508 may be a stack in which titanium nitride and tungsten are sequentially stacked. According to another embodiment of the disclosure, the buried word line 508 may be formed of titanium nitride (TiN) only.

First and second impurity regions 510 and 511 may be formed in the substrate 501. The first and second impurity regions 510 and 511 may be spaced apart from each other by the word line trench 506. The first and second impurity regions 510 and 511 may be referred to as first and second source/drain regions. The first and second impurity regions 510 and 511 may include an N-type impurity such as arsenic (As) or phosphorus (P). Accordingly, the buried word line 508 and the first and second impurity regions 510 and 511 may become a cell transistor. The cell transistor may improve a short channel effect by the buried word line 508.

A bit line contact plug 513 may be formed over the substrate 501. The bit line contact plug 513 may be coupled to the first impurity region 510. The bit line contact plug 513 may be positioned in a bit line contact hole 512. The bit line contact hole 512 may be formed in the hard mask layer 505. The hard mask layer 505 may be formed over the substrate 501. The bit line contact hole 512 may expose the first impurity region 510. The bottom surface of the bit line contact plug 513 may be lower than the top surface of the substrate 501. The bit line contact plug 513 may be formed of polysilicon or a metal material. A portion of the bit line contact plug 513 may have a line width that is shorter than the diameter of the bit line contact hole 512. A bit line 514 may be formed over the bit line contact plug 513. A bit line hard mask 515 may be formed over the bit line 514. The stacked structure of the bit line 514 and the bit line hard mask 515 may be referred to as a bit line structure BL. The bit line 514 may have a line shape extending in a direction intersecting with the buried word line 508. A portion of the bit line 514 may be coupled to the bit line contact plug 513. The bit line 514 may include a metal material. The bit line hard mask 515 may include a dielectric material.

A bit liner spacer 516 may be formed on a sidewall of the bit line structure BL. The bottom portion of the bit liner spacer 516 may extend to be formed on both sides of the bit line contact plug 513. The bit liner spacer 516 may include silicon oxide, silicon nitride, or a combination thereof. According to another embodiment of the disclosure, the bit liner spacer 516 may include an air gap. For example, it may be a NAN (Nitride-Air gap-Nitride) structure in which an air gap is positioned between silicon nitrides.

A storage node contact plug SNC may be formed between the neighboring bit line structures BL. The storage node contact plug SNC may be formed in a storage node contact hole 518. The storage node contact plug SNC may be coupled to the second impurity region 511. The storage node contact plug SNC may include a lower plug 519 and an upper plug 521. The storage node contact plug SNC may further include an ohmic contact layer 520 between the lower plug 519 and the upper plug 521. The ohmic contact layer 520 may include a metal silicide. The upper plug 521 may include a metal material, and the lower plug 519 may include a silicon-containing material.

From the perspective of a direction parallel to the bit line structure BL, a plug isolation layer 517 may be formed between the neighboring storage node contact plugs SNCs. The plug isolation layer 517 may be formed between the neighboring bit line structures BL and may provide a storage node contact hole 518 together with the hard mask layer 505.

The capacitor 600 may be coupled to the storage node contact plug SNC.

Figure 24:
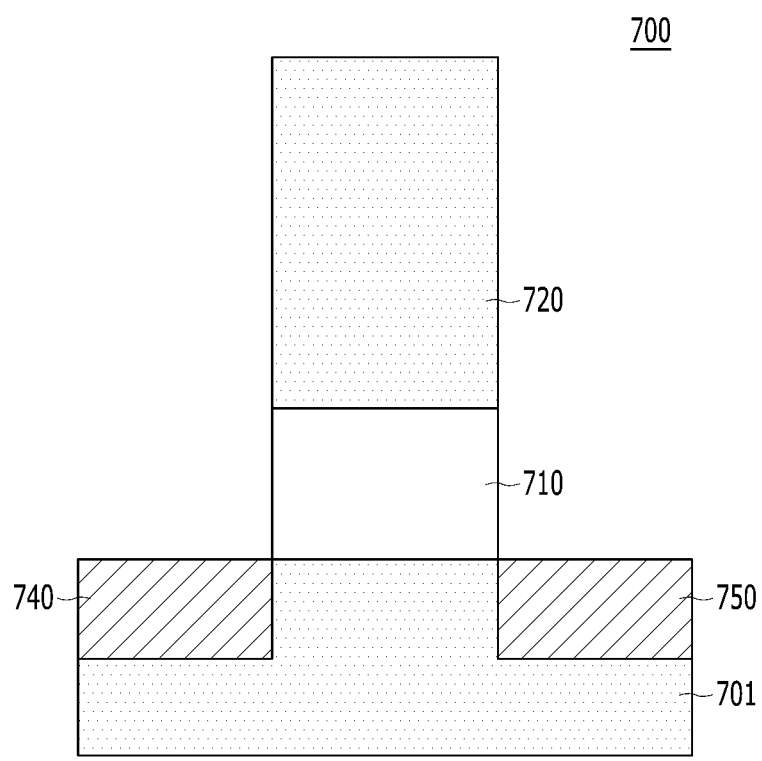
FIG. 24 is a cross-sectional view illustrating a semiconductor device in accordance with another embodiment of the disclosure.

FIG. 24 is a cross-sectional view illustrating a semiconductor device in accordance with another embodiment of the disclosure.

Referring to FIG. 24, a semiconductor device 700 may include a transistor. The semiconductor device 700 may include a semiconductor substrate 701, a gate dielectric layer 710, a gate electrode 720, a source region 740, and a drain region 750. The gate dielectric layer 710 may be formed over the semiconductor substrate 701, and the gate electrode 720 may be formed over the gate dielectric layer 710. The source region 740 and the drain region 750 may be formed in the semiconductor substrate 701.

The gate dielectric layer 710 may include one from among the multilayer stacks in accordance with the above-described embodiments of the disclosure. In this embodiment, the gate dielectric layer 710 may be a multilayer stack including a seed layer and a high-k dielectric layer. The seed layer and the high-k dielectric layer may have a rocksalt crystal structure, and the high-k dielectric layer may have a dielectric constant of 50 or higher. Alternatively, for example, the gate dielectric layer 710 may be a multilayer stack including a seed layer and a high-k dielectric layer structure. The high-k dielectric layer structure may include at least two high-k dielectric layers and at least one strain applying layer, and the strain applying layer may be interposed between adjacent high-k dielectric layers.

The gate electrode 720 may be a metal gate electrode including a metal-based material. The gate electrode 720 may include tungsten, aluminum, tungsten nitride, titanium nitride, titanium, or a combination thereof.

The source region 740 and the drain region 750 may include an impurity of the same conductive type. The source region 740 and the drain region 750 may include an N-type impurity or a P-type impurity. The N-type impurity may include phosphorus or arsenic, and the P-type impurity may include boron or indium.

According to another embodiment of the disclosure, a thin interface layer may be further formed between the gate dielectric layer 710 and the semiconductor substrate 701. Here, the thin interface layer may include silicon oxide or silicon oxynitride.

According to another embodiment of the disclosure, the gate dielectric layer 710 may be applied to the gate dielectric layer of a FinFET.

The multilayer stack in accordance with the above-described embodiments of the disclosure may be applied to a metal-insulator-metal (MIM) capacitor. For example, the MIM capacitor may include a first metal electrode, a second metal electrode, and a multilayer stack formed between the first metal electrode and the second metal electrode. The multilayer stack of the MIM capacitor may include one from among the multilayer stacks of the above-described embodiments of the disclosure. For example, the multilayer stack may include a seed layer and a high-k dielectric layer. The seed layer and the high-k dielectric layer may have a rocksalt crystal structure, and the high-k dielectric layer may have a dielectric constant of 50 or higher. Alternatively, for example, the multilayer stack may include a seed layer and a high-k dielectric layer structure. The high-k dielectric layer structure may include at least two high-k dielectric layers and at least one strain applying layer, and the strain applying layer may be interposed between adjacent high-k dielectric layers.

The multilayer stack in accordance with the above-described embodiments of the disclosure may be applied to an embedded DRAM. For example, the embedded DRAM may include a logic circuit and an embedded DRAM, and the capacitor of the embedded DRAM may include a lower electrode, a multilayer stack, and an upper electrode. The multilayer stack of the capacitor of the embedded DRAM may include one from among the multilayer stack of the above-described embodiments of the disclosure. For example, the multilayer stack may include a seed layer and a high-k dielectric layer. The seed layer and the high-k dielectric layer may have a rocksalt crystal structure, and the high-k dielectric layer may have a dielectric constant of 50 or higher. Alternatively, for example, the multilayer stack may include a seed layer and a high-k dielectric layer structure. The high-k dielectric layer structure may include at least two high-k dielectric layers and at least one strain applying layer, and the strain applying layer may be interposed between adjacent high-k dielectric layers.

The multilayer stack in accordance with the above-described embodiments of the disclosure may be applied to a 3D NAND (Three-Dimensional NAND). For example, 3D NAND the 3D NAND may include a multilayer stack including a pillar-type channel layer, a word line surrounding the pillar-type channel layer, and a tunnel dielectric layer between the pillar-type channel layer and the word line. At least the tunnel dielectric layer of the multilayer stack of the 3D NAND may include a seed layer and a high-k dielectric layer. The seed layer and the high-k dielectric layer may have a rocksalt crystal structure, and the high-k dielectric layer may have a dielectric constant of 50 or higher. Alternatively, for example, at least the tunnel dielectric layer of the multilayer stack of the 3D NAND may include a seed layer and a high-k dielectric layer structure. The high-k dielectric layer structure may include at least two high-k dielectric layers and at least one strain applying layer, and the strain applying layer may be interposed between adjacent high-k dielectric layers.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a first electrode;
a second electrode; and
a multilayer stack that is interposed between the first electrode and the second electrode and includes a seed layer and a high-k dielectric layer,
wherein each of the seed layer and the high-k dielectric layer has a rocksalt crystal structure,
wherein the high-k dielectric layer exhibits a dielectric constant (k) of fifty (50) or higher,
wherein the multilayer stack further includes an additional high-k dielectric layer disposed over the high-k dielectric layer, and
wherein the additional high-k dielectric layer exhibits a dielectric constant (k) lower than the high-k dielectric layer.

2. The semiconductor device of claim 1, wherein the seed layer includes a first seed layer and a second seed layer, wherein the first seed layer includes magnesium oxide (MgO) having a rocksalt crystal structure, and the second seed layer is disposed over the first seed layer and includes beryllium oxide (BeO) having a rocksalt crystal structure.

3. The semiconductor device of claim 1, wherein the seed layer includes beryllium-magnesium oxide (BexMg1-xO, 0<x<0.5) having a rocksalt crystal structure.

4. The semiconductor device of claim 1, wherein the seed layer exhibits a dielectric constant (k) of fifteen (15) to twenty (20).

5. The semiconductor device of claim 1, wherein the high-k dielectric layer includes BeO having a rocksalt crystal structure that is stable under room temperature and atmospheric pressure.

6. The semiconductor device of claim 1, wherein the high-k dielectric layer includes a single-layer structure or a multilayer structure containing two or more layers,
wherein, when the high-k dielectric layer includes the multilayer structure, each layer included in the multilayer structure includes BeO having a rocksalt crystal structure, and
wherein the high-k dielectric layer including the multilayer structure has a thickness greater than the high-k dielectric layer including the single-layer structure.

7. The semiconductor device of claim 1, further comprising an interface layer disposed between the second electrode and the multilayer stack.

8. A semiconductor device, comprising:
a first electrode;
a second electrode; and
a multilayer stack that is interposed between the first electrode and the second electrode and includes a seed layer and a high-k dielectric layer structure,
wherein the high-k dielectric layer structure includes at least two high-k dielectric layers and at least one strain applying layer,
wherein the multilayer stack further includes an additional high-k dielectric layer disposed over the high-k dielectric layer that is adjacent to the second electrode from among the at least two high-k dielectric layers,
wherein the additional high-k dielectric layer exhibits a dielectric constant (k) that is lower than the dielectric constant (k) of the at least two high-k dielectric layers, and
wherein the strain applying layer is interposed between adjacent high-k dielectric layers.

9. The semiconductor device of claim 8, wherein the strain applying layer is configured to stabilize a rocksalt crystal structure of the at least two high-k dielectric layers by applying strain to the at least two high-k dielectric layers.

10. The semiconductor device of claim 8, wherein the strain applying layer includes magnesium oxide (MgO), beryllium-magnesium oxide (BexMg1-xO, 0<x<0.5), or a combination thereof.

11. The semiconductor device of claim 8, wherein the seed layer includes a first seed layer and a second seed layer, wherein the first seed layer includes magnesium oxide (MgO) having a rocksalt crystal structure, and the second seed layer is disposed over the first seed layer and includes beryllium oxide (BeO) having a rocksalt crystal structure.

12. The semiconductor device of claim 8, wherein the seed layer includes beryllium-magnesium oxide (BexMg1-xO, 0<x<0.5) having a rocksalt crystal structure.

13. The semiconductor device of claim 8, wherein the seed layer exhibits a dielectric constant (k) of 15 to 20.

14. The semiconductor device of claim 8, wherein each of the at least two high-k dielectric layers includes beryllium oxide (BeO) having a rocksalt crystal structure that is stable under room temperature and atmospheric pressure.

15. The semiconductor device of claim 8, wherein each of the at least two high-k dielectric layers exhibits a dielectric constant (k) of fifty (50) or higher.

16. The semiconductor device of claim 8, further comprising an interface layer disposed between the second electrode and the multilayer stack.

17. A semiconductor device, comprising:
a first electrode;
a second electrode; and
a multilayer stack that is interposed between the first electrode and the second electrode and includes a seed layer and a high-k dielectric layer,
wherein the seed layer includes beryllium-magnesium oxide ($Be_xMg_{1-x}O$, $0<x<0.5$) having a rocksalt crystal structure, and
wherein the high-k dielectric layer includes BeO having a rocksalt crystal structure that is stable under room temperature and atmospheric pressure and exhibits a dielectric constant (k) of fifty (50) or higher.

18. The semiconductor device of claim 17, wherein the seed layer includes a first seed layer and a second seed layer, wherein the first seed layer includes magnesium oxide (MgO) having a rocksalt crystal structure, and the second seed layer is disposed over the first seed layer and includes beryllium oxide (BeO) having a rocksalt crystal structure.

19. The semiconductor device of claim 17, wherein the seed layer exhibits a dielectric constant (k) of fifteen (15) to twenty (20).

20. The semiconductor device of claim 17, wherein the high-k dielectric layer includes a single-layer structure or a multilayer structure containing two or more layers,
wherein, when the high-k dielectric layer includes the multilayer structure, each layer included in the multilayer structure includes BeO having a rocksalt crystal structure, and
wherein the high-k dielectric layer including the multilayer structure has a thickness greater than the high-k dielectric layer including the single-layer structure.

21. The semiconductor device of claim 17, wherein the multilayer stack further includes an additional high-k dielectric layer disposed over the high-k dielectric layer.

22. The semiconductor device of claim 21, wherein the additional high-k dielectric layer exhibits a dielectric constant (k) lower than the high-k dielectric layer.

23. The semiconductor device of claim 17, further comprising an interface layer disposed between the second electrode and the multilayer stack.

24. A semiconductor device, comprising:
a first electrode;
a second electrode; and
a multilayer stack that is interposed between the first electrode and the second electrode and includes a seed layer and a high-k dielectric layer structure,
wherein the seed layer includes beryllium-magnesium oxide ($Be_xMg_{1-x}O$, $0<x<0.5$) having a rocksalt crystal structure,
wherein the high-k dielectric layer structure includes at least two high-k dielectric layers and at least one strain applying layer,
wherein each of the at least two high-k dielectric layers includes beryllium oxide (BeO) having a rocksalt crystal structure that is stable under room temperature and atmospheric pressure, and
wherein the strain applying layer is interposed between adjacent high-k dielectric layers.

25. The semiconductor device of claim 24, wherein the strain applying layer is configured to stabilize a rocksalt crystal structure of the at least two high-k dielectric layers by applying strain to the at least two high-k dielectric layers.

26. The semiconductor device of claim 24, wherein the strain applying layer includes magnesium oxide (MgO), beryllium-magnesium oxide ($Be_xMg_{1-x}O$, $0<x<0.5$), or a combination thereof.

27. The semiconductor device of claim 24, wherein the seed layer exhibits a dielectric constant (k) of 15 to 20.

28. The semiconductor device of claim 24, wherein each of the at least two high-k dielectric layers exhibits a dielectric constant (k) of fifty (50) or higher.

29. The semiconductor device of claim 24, wherein the multilayer stack further includes an additional high-k dielectric layer disposed over the high-k dielectric layer that is adjacent to the second electrode from among the at least two high-k dielectric layers.

30. The semiconductor device of claim 29, wherein the additional high-k dielectric layer exhibits a dielectric constant (k) that is lower than the dielectric constant (k) of the at least two high-k dielectric layers.

31. The semiconductor device of claim 24, further comprising an interface layer disposed between the second electrode and the multilayer stack.

* * * * *